(12) United States Patent
Laaser

(10) Patent No.: US 6,411,167 B2
(45) Date of Patent: Jun. 25, 2002

(54) AMPLIFIER OUTPUT STAGE

(75) Inventor: Peter Laaser, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/771,911

(22) Filed: Jan. 29, 2001

Related U.S. Application Data

(63) Continuation of application No. PCT/DE99/02129, filed on Jul. 9, 1999.

(30) Foreign Application Priority Data

Jul. 29, 1998 (DE) .......................... 198 34 209

(51) Int. Cl.[7] .............................................. H03F 3/26
(52) U.S. Cl. ...................................... 330/264; 330/267
(58) Field of Search ................................ 330/263, 264, 330/267, 268

(56) References Cited

U.S. PATENT DOCUMENTS 4,439,743 A * 3/1984 Schwarz et al. ............. 330/267
4,827,223 A * 5/1989 Gross ......................... 330/267
5,973,563 A * 10/1999 Seven ..................... 330/268 X

* cited by examiner

Primary Examiner—Steven J. Mottola
(74) Attorney, Agent, or Firm—Herbert L. Lerner; Laurence A. Greenberg; Werner H. Stemer

(57) ABSTRACT

An amplifier output stage is described containing a preliminary stage, a final stage and a control device. The quiescent current that flows through transistors of the final stage is adjusted by the preliminary stage. For this, a current that is proportional to the quiescent current is generated in the control device from which control voltages are derived and controlled. The preliminary stage contains adjustable current sources for adjusting the quiescent current in a final step which are controlled by the control voltages.

11 Claims, 2 Drawing Sheets

AMPLIFIER OUTPUT STAGE

CROSS-REFERENCE TO RELATED APPLICATION

This application is a continuation of copending International Application No. PCT/DE99/02129, filed Jul. 9, 1999, which designated the United States.

BACKGROUND OF THE INVENTION

Field of the Invention

The invention relates to an amplifier output stage containing a final stage and a preliminary stage connected to the final stage and having a multiplicity of adjustable current stages for setting a quiescent current in the final stage. A control device is connected to the preliminary stage and has a control current from which control voltages are generated and regulated in accordance with the multiplicity of adjustable current sources of the preliminary stage. Each of the control voltages controls precisely one of the adjustable current sources in the preliminary stage.

Published European Patent Application EP-0115949 A1 describes a buffer circuit having a high impedance. The buffer circuit has a main buffer circuit section formed from a pair of complementary input transistors whose base terminals are connected to one another, and also an additional circuit section having the same circuit structure as the main buffer circuit section. A feedback signal generated by the additional circuit section is fed to the additional circuit section and to the main buffer circuit section in order that an output signal of the additional circuit section assumes a predetermined value.

In amplifiers which have to supply high currents for driving large loads, a complementary emitter/source follower in push-pull class AB operation is usually used as the final stage (see the reference by U. Tietze, Ch. Schenck, titled "Halbleiterschaltungstechnik" [Semiconductor Circuitry], 9th edition, pp. 516 to 518 and pp. 521 to 523). In this operating mode, a parallel-path current, referred to as a quiescent current, continuously flows through the complementary final-stage transistors in a non-driven state of the amplifier. Power is consumed as a result of this quiescent current, which results in that the final-stage transistors are heated. It proves to be particularly problematic to set this temperature-dependent quiescent current to a low and constant value over a large temperature range, in order to minimize the current consumption in the final stage and to avoid distortions.

IEEE Journal of Solid-State Circuits, Vol. 27, No. 4, pages 539–544, April 1992, titled "A CMOS Line Driver with 80-dB Linearity for ISDN Applications", by H. Knorramabadi, discloses a line driver amplifier for an integrated services digital network (ISDN) U interface, in which a so-called error amplifier which drives the final stage is used. A disadvantage of such a configuration is that the error amplifier lies directly in the signal path of the amplifier and influences the bandwidth of the amplifier. Moreover, the quiescent current through the final-stage transistors depends on an offset voltage of the error amplifiers.

IEEE Journal of Solid-State Circuits, Vol. 32, No. 32, pages 169–176, February 1997, titled "A Rail-to-Rail, Constant Gain, Buffered Op-Amp for Real Time Video Applications", by L. Moldovan and H. H. Li, and IEEE Journal of Solid-State Circuits, Vol. 29, No. 1, pages 63–65, January 1994, titled "Digital-Compatible High-Performance Operational Amplifier with Rail-to-Rail Input and Output Ranges", by W. -CH. S. Wu, W. J. Helms, J. A. Kuhn, and B. E. Byrkett describe amplifiers in which the quiescent current in the final stage is set by an input stage and is thus directly dependent on the input signals and current or voltage fluctuations of the input stage.

In the reference titled "Integrierte Schaltungen" [Integrated Circuits], by A. Schlachetzki, and W. V. Munch, Teubner 1978, a complementary emitter follower with quiescent current setting is illustrated in FIG. 4.8 on page 144, in the case of which the quiescent current to be set is mirrored into the final-stage transistors T1 and T2 via transistors T3 and T4 connected as diodes. However, the quiescent current is not freely adjustable in this configuration.

SUMMARY OF THE INVENTION

It is accordingly an object of the invention to provide an amplifier output stage which overcomes the above-mentioned disadvantages of the prior art devices of this general type, which has better adjustability and regulation of the quiescent current in the final stage and in which the quiescent current regulation and setting lie outside the signal path of the amplifier.

With the foregoing and other objects in view there is provided, in accordance with the invention, an amplifier output stage. The amplifier output stage contains a final stage, a preliminary stage connected to the final stage and has a multiplicity of adjustable current sources for setting a quiescent current in the final stage, and a control device connected to the preliminary stage and having a control current from which control voltages are generated and regulated in accordance with the multiplicity of adjustable current sources of the preliminary stage. Each of the control voltages control precisely one of the multiplicity of adjustable current sources in the preliminary stage, and the control current in the control device is proportional to the quiescent current in the final stage.

One embodiment of the amplifier output stage contains the preliminary stage, the final stage and the control device. In this case, the quiescent current through the transistors of the final stage is set by the preliminary stage, which is connected to the control device. The preliminary stage has controllable current sources, by which the voltage at the control terminals of the final-stage transistors is set. This voltage defines the quiescent current through the final-stage transistors. In the control device, a control current is set, which is proportional to the quiescent current flowing through the final-stage transistors. From this, control voltages are generated for setting the current sources in the preliminary stage, which in turn set the quiescent current in the final stage. It is advantageous that the control device lies outside the signal path of the amplifier output stage and, consequently, does not limit the bandwidth of the amplifier output stage. In the control device, moreover, the control current and thus the quiescent current can be set to an arbitrary and exact value.

In a preferred embodiment of the invention, the preliminary stage of the amplifier output stage has two emitter or source follower circuits that the final stage decouples from an amplifier input stage which drives the amplifier output stage. This advantageously reduces the load on the amplifier input stage since the preliminary-stage transistors driven by the amplifier input stage represent a lower capacitive load than the final-stage transistors for the input stages. Each emitter or source follower circuit has a controllable current source that sets the quiescent current through the transistors of the final stage. In this embodiment, it is advantageous that only one transistor lies in the signal path of the amplifier output stage, the limiting frequency of which transistor is so high that the bandwidth of the amplifier is not restricted.

A preferred embodiment of the control device has a first and second emitter or source follower circuit, which each simulate the emitter or source follower circuits of the preliminary stage in the non-driven state. Each emitter or source follower circuit has a controllable current source. The inputs of the two emitter or source follower circuits are connected to a voltage corresponding to the output voltage of the amplifier output stage in the quiescent state. It is advantageous that similar operating conditions apply to the emitter or source follower circuits of the preliminary stage and of the control device.

In a preferred embodiment, the final stage has a first and second transistor which are operated in push-pull class AB operation. Advantages include the lower harmonic distortion factor compared with a final stage in class A operation and the lower current consumption compared with a final stage in class B operation.

In a preferred embodiment, the control device furthermore has a first and second transistor and an adjustable current source. In this case, the two transistors simulate the two transistors of the final stage and the current source feeds a control current into both transistors. It is advantageous that the control current fed in is adjustable and proportional to the quiescent current in the final stage.

In a preferred embodiment, the control device has a first and a second mirror transistor, the first mirror transistor mirroring the current through the first transistor and the second mirror transistor mirroring the current through the second transistor. The voltage at the control terminals of the mirror transistors is advantageously used for generating the control voltages.

The control device particularly preferably has a first and a second control transistor, the control transistors transferring the input voltage at the inputs of the emitter follower or source follower circuits to the first and second transistor. Consequently, the simulated final stage has a quiescent output potential which advantageously corresponds to the input voltage at the inputs of the emitter follower or source follower circuits and the quiescent output potential can be set by way of the input voltage of the emitter follower or source follower circuits.

In a particularly preferred embodiment of the control device, a first and second operational amplifier regulates the current sources contained in the emitter or source follower circuits in such a way that the voltage at the output of the operational amplifier can be used for setting the current sources in the preliminary stage. It is advantageous here that the voltage is dependent only as a result of the offset voltage of a few mV of the operational amplifiers and on the ratio of a few transistors of the current mirror and the final stage. This regulation of the control voltage has the major advantage that it is very accurate and disturbing influences (OP offset voltage, transistor ratios) have a negligible influence on the control voltage.

In a particularly preferred embodiment of the invention, the amplifier output stage is embodied using CMOS technology. Advantages of this embodiment include the capability of integration with further circuits using CMOS technology, and also the widespread use of CMOS and the relatively small area requirement compared with other technologies.

In a preferred embodiment, the current mirrors of the control device of the amplifier output stage have transistor ratios which conduct the current impressed into the two current mirrors almost completely through in each case one of the two transistors of the current mirrors. As a result, a potential which, applied to the control terminals of the transistors of the final stage, produces a defined quiescent current through the transistors of the final stage is advantageously established at the control terminal common to both current mirror transistors.

Through a preferred dimensioning of the ratios of in each case a transistor of the current mirror and a transistor of the final stage, the quiescent current through the transistor of the final stage can be set very precisely. A ratio of 20 is particularly preferred here, which ratio can be established very simply through the dimensioning of the transistors.

In accordance with an added feature of the invention, the control current in the control device is a fraction of the quiescent current flowing through the first transistor and the second transistor of the final stage. The fraction is determined by a channel width/length ratio of the second transistor of the control device, by a channel width/length ratio of the second transistor of the final stage, by a channel width/length ratio of the first transistor of the control device, and by a channel width/length ratio of the first transistor of the final stage.

The integration of the amplifier output stage on an integrated circuit is a preferred embodiment. A great advantage here is the good adjustability of the ratios of the transistor geometries.

In a particularly preferred embodiment, the emitter or source follower circuits of the preliminary stage and of the control device are placed locally next to one another on an integrated circuit. This advantageously reduces the influence of process fluctuations on the quiescent current through the transistors of the final stage. Moreover, temperature differences between the individual circuit sections of the amplifier output stage have a negligible influence on the quiescent current.

Other features which are considered as characteristic for the invention are set forth in the appended claims.

Although the invention is illustrated and described herein as embodied in an amplifier output stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
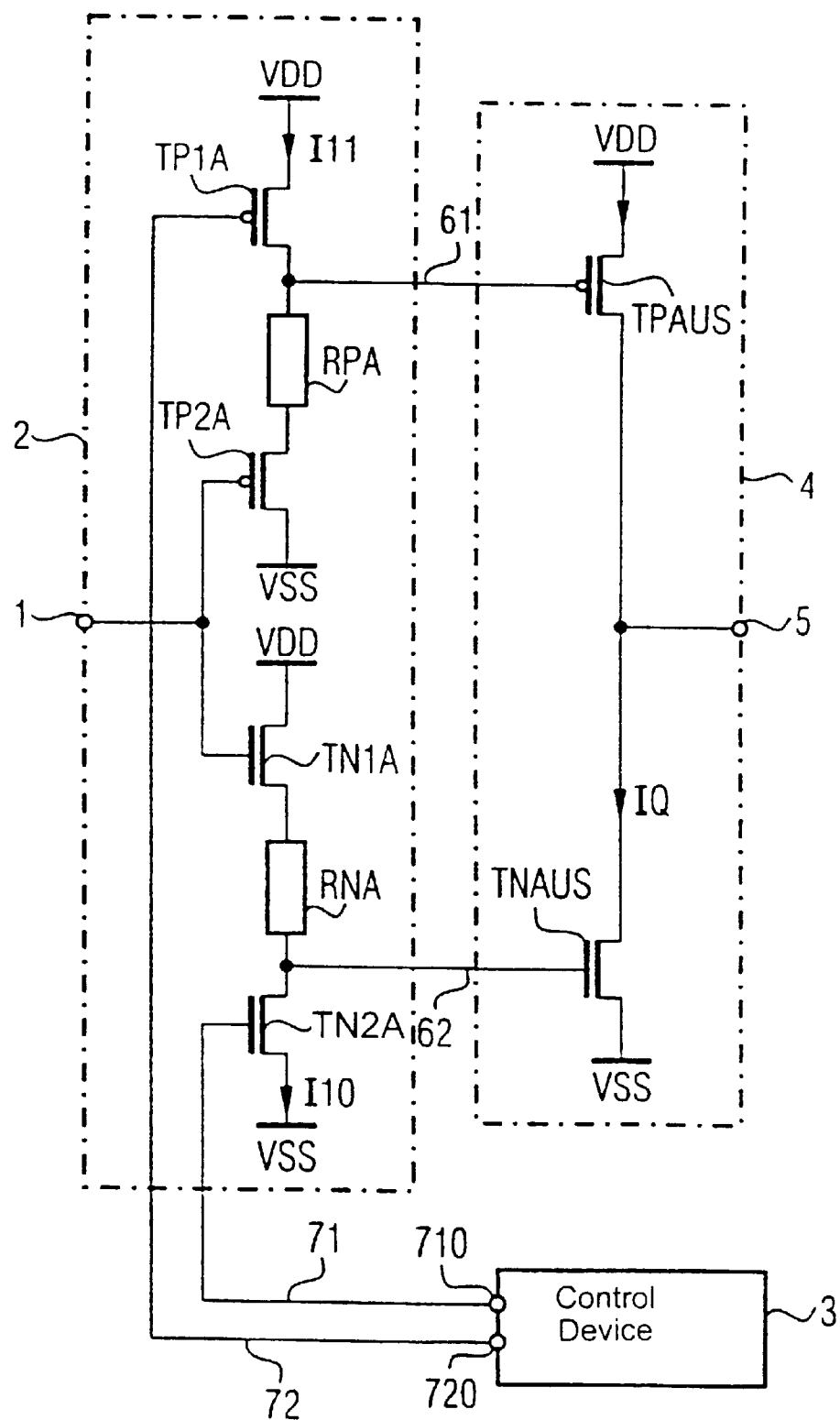
FIG. 1 is a circuit diagram of an exemplary embodiment of an amplifier according to the invention.

The exemplary embodiment described below is concerned with an embodiment of the invention using CMOS technology. In all the figures of the drawing, sub-features and integral parts that correspond to one another bear the same reference symbol in each case. Referring now to the figures of the drawing in detail and first, particularly, to FIG. 1 thereof, there is shown an amplifier output stage containing a preliminary stage 2, a final stage 4 and a control device 3. The preliminary stage 2 is connected to the final stage 4 through two lines 61 and 62 and the control device 3 is connected to the preliminary stage 2 through two lines 71 and 72. A signal is fed in through an input 1 of the amplifier output stage, the signal coming, for example, from an input stage having a high gain. An amplified signal is available at an output 5.

The preliminary stage 2 contains two source follower circuits.

A first source follower circuit contains a first n-channel MOSFET TN1A, whose drain terminal is connected to a first voltage supply VDD of the amplifier and whose gate terminal is connected to the input 1 of the amplifier output stage. The first transistor TN1A is furthermore connected via a resistor RNA, which is connected to a source terminal, to a drain terminal of a second n-channel MOSFET transistor TN2A, whose source terminal is connected to a second voltage supply VSS.

A second source follower is constructed in a mirror-inverted manner with respect to the first source follower using p-channel technology and contains a first p-channel MOSFET TP1A, whose drain terminal is connected to the first supply voltage VDD of the amplifier and whose source terminal is connected via a resistor RPA to a drain terminal of a second p-channel MOSFET TP2A, whose source terminal is in turn connected to the second supply voltage VSS. A gate terminal of the second transistor TP2A is connected to the input 1 of the amplifier output stage.

The preliminary stage 2 is connected to the final stage 4 through the two lines 61 and 62. The gate terminals of the second transistor TN2A of the first source follower and of the first transistor TP1A of the second source follower are connected to the control device 3 through the lines 71 and 72. The control device 3 controls the voltages which are present at the gate terminals of the transistors TN2A and TP1A via the lines 71 and 72, so that the transistors TN2A and TP1A act like controllable current sources. Variation of the voltages adjusts currents I10 and I11 that flow through the first and second source followers. As a result, it is possible to set the voltages that are present via the lines 61 and 62 at the gate terminals of transistors TPAUS and TNAUS of the final stage 4. The setting of these voltages results in the setting of the quiescent current IQ that flows through the two transistors TPAUS and TNAUS of the final stage. In addition, the quiescent potential is set at the output terminal 5 of the final stage 4 of the amplifier.

The final stage 4 is constructed as a complementary source follower or common-source circuit and contains the p-channel MOSFET TPAUS, whose drain terminal is connected to the first supply voltage VDD of the amplifier, and the n-channel MOSFET TNAUS, whose source terminal is connected to the second supply voltage VSS. A source terminal of the transistor TPAUS is connected to a drain terminal of the transistor TNAUS and forms the output 5 of the amplifier. If the final stage 4 is not driven, a parallel-path current IQ corresponding to the quiescent current of the final stage flows through the two transistors TPAUS and TNAUS. The final-stage transistors are dimensioned for a high current yield and, to that end, have a very large channel width.

Figure 2:
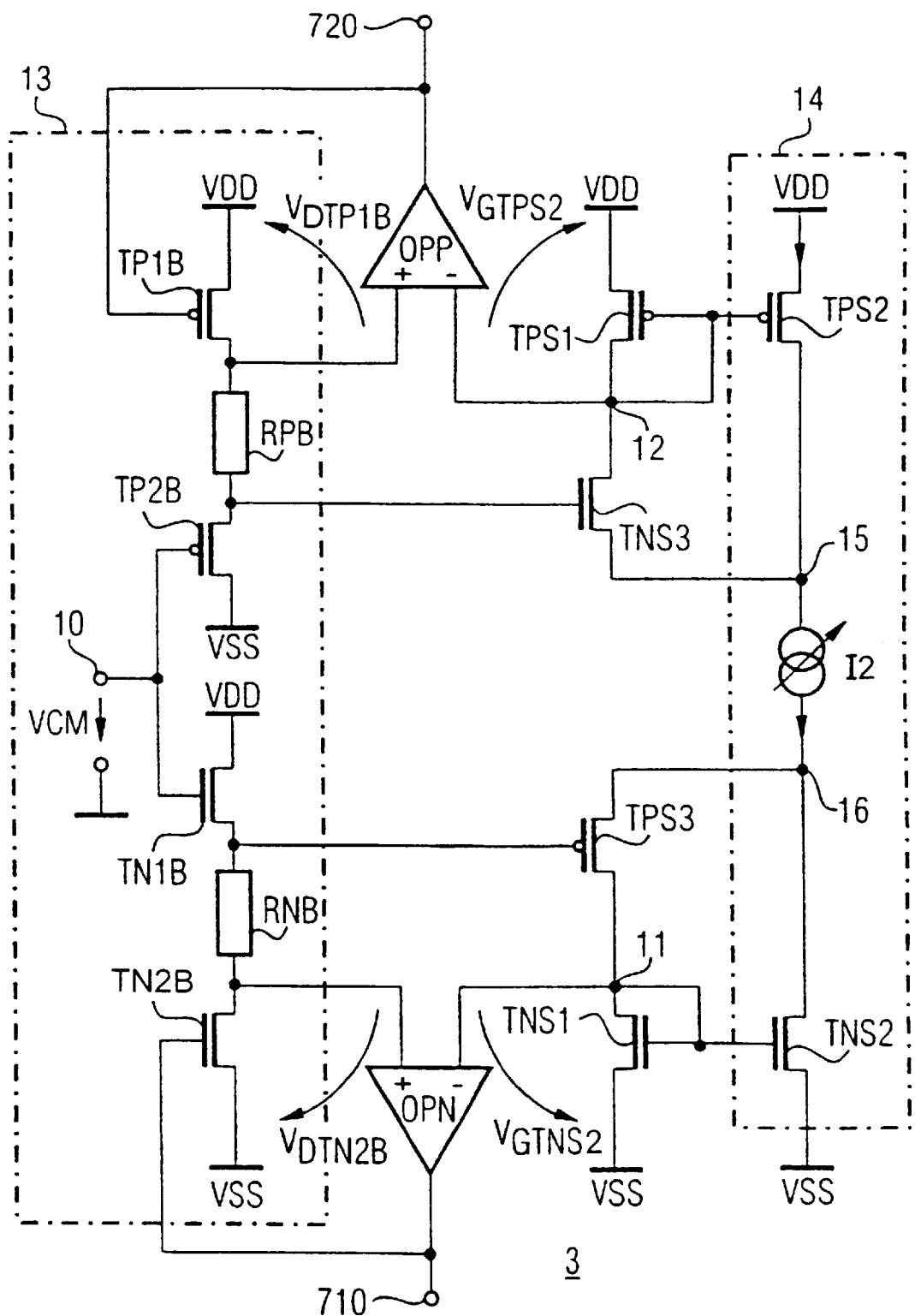
FIG. 2 is a circuit diagram of a structure of a control device for setting a quiescent current in a final stage of the amplifier according to the invention.

The control device 3 serves for setting and regulating the quiescent current in the final stage 4 and has two source follower circuits TN1B, RNB, TN2B and TP1B, RPB, TP2B analogous to the preliminary stage (see FIG. 2). The control device further has a final-stage circuit TP2S, TN2S, two operational amplifiers for quiescent current regulation OPP, OPN, two mirror transistors TPS1, TNS1, two control transistors TNS3, TPS3 and an adjustable current source I2.

The first source follower is constructed like the first source follower TN1A, RNA, TN2A of the preliminary stage and contains the n-channel MOSFETs TN1B and TN2B, whose source and drain terminals are connected via a resistor RNB. The drain terminal of the transistor TN1B is connected to the first supply voltage VDD of the amplifier and the source terminal of the transistor TN2B is connected to the second supply voltage VSS.

The second source follower is constructed like the second source follower TP1A, RPA, TP2A of the preliminary stage and contains the p-channel MOSFETs TP1B and TP2B, whose source and drain terminals are connected to one another via a resistor RPB. The drain terminal of the transistor TP1B is connected to the first supply voltage VDD of the amplifier and the source terminal of the transistor TP2B is connected to the second supply voltage VSS.

The gate terminals of the transistors TN1B and TP2B are connected to a voltage source 10. These two source follower circuits 13 simulate the two source follower circuits of the preliminary stage 2 in the non-driven, i.e. quiescent, state of the amplifier. To that end, a voltage VCM of the voltage source 10 is fixed at a value within the range defined by the first VDD and second VSS supply voltage and corresponds to the quiescent output potential of the amplifier output stage. The voltage VCM is preferably set to the potential (VDD+VSS)/2, which is intended to be established at the output 5 of the amplifier output stage when the amplifier is not amplifying any signals.

The control transistor TPS3 and TNS3 serves for establishing the voltage VCM of the voltage source 10 at a node 15 and 16. Consequently, TPS2, I2 and TNS2 simulate the final stage 4 in the quiescent state with the output potential VCM and a quiescent current I2. In order to obtain the potential VCM at the nodes 15 and 16, the control transistors TPS3 and TNS3 are dimensioned in such a way that the threshold voltage losses through the transistors TP2B and TN1B cancel one another out.

The current I2 impressed by the adjustable current source is then set proportionally to the quiescent current IQ through the transistors TPAUS and TNAUS of the final stage 4:

$$I2=IQ/N.$$

Through the channel width/length ratio W/L of the MOSFETs TNS2 and TNAUS, and TPS2 and TPAUS, the factor N results as follows:

$$W/L(TNS2)=W/L(TNAUS)/N$$

$$W/L(TPS2)=W/L(TPAUS)/N.$$

In order to obtain a ratio of the transistors TNS2 and TNAUS, and TPS2 and TPAUS, which is as exact as possible, these transistors locally lie as close together as possible in an integrated circuit. Inaccuracies on account of technological fluctuations are thus largely avoided.

The current I2 is in each case mirrored into a very small current through the mirror transistors TPS1 and TNS1 and a voltage VGTPS2 and VGTNS2 is established at nodes 12 and 11, which voltage corresponds to the control voltage for the transistors TPAUS and TNAUS of the final stage 4, in order to obtain a quiescent current IQ through the transistors of the final stage. To that end, the following must hold true for the channel width/length ratio W/L of the MOSFETs TNS1 and TNS2, and TPS1 and TPS2:

$$W/L(TNS1) \ll W/L(TNS2) \text{ and } W/L(TPS1) \ll W/L(TPS2).$$

The first operational amplifier OPP compares the voltage VGTPS2 with the voltage VDTP1B of the non-driven source follower circuit TP2B, RPB, TP1B and, via the operational output of the amplifier which is fed back to the control terminal of the transistor TP1B, sets the voltage VDTP1B like the voltage VGTPS2. The feedback output voltage is used, via a terminal 720, for controlling the current source TP1A of the preliminary stage 2. In this way, the voltage VGTPS2 is transferred to the transistor TPAUS of the final stage 4, where it sets the desired quiescent current IQ.

The second operational amplifier OPN compares the voltage $V_{GTNS2}$ with the voltage $V_{DTN2B}$ of the non-driven source follower circuit TN2B, RNB, TN1B and, via the output of the operational amplifier which is fed back to the control terminal of the transistor TN2B, sets the voltage $V_{DTN2B}$ like the voltage $V_{GTNS2}$. The feedback output voltage is used, via a terminal 710, for controlling the current source TN2A of the preliminary stage 2. In this way, the voltage $V_{GTNS2}$ is transferred to the transistor TNAUS of the final stage 4, where it sets the desired quiescent current IQ.

In the case of low supply voltages VDD and VSS or high absolute values of the transistor threshold voltages, the resistors RNA, RNB, RPA and RPB can be omitted.

Consequently, the setting of the quiescent current IQ through the final transistors TPAUS and TNAUS depends exclusively on an offset voltage of the two operational amplifiers OPN and OPP of the control device 3 and the accuracy of a factor N resulting from the ratio of the transistors TNAUS and TNS2, and TPAUS and TPS2.

By virtue of the fact that the offset voltage of the two operational amplifiers is very low relative to the voltage at the gate terminals of the transistors TN2B and TN2A, and TP1B and TP1A (a few mV or 1–2 orders of magnitude smaller than the gate voltages), the influence of the offset voltages on the accuracy of the quiescent current regulation is negligible.

Temperature fluctuations likewise have only little effect on the quiescent current since, particularly in the case of integration of the amplifier output stage, the temperature differences between the individual transistors are negligible on account of the local proximity to one another.

In addition to the transistors of the input stage and of the final stage, only the transistors TN1A and TP2A of the preliminary stage 2 lie in the signal path of the amplifier. The resulting pole in the transfer function of the amplifier only slightly influences the bandwidth of the amplifier since the pole is at very high frequencies.

In order to obtain a low current consumption of the amplifier, the quiescent current IQ through the transistors of the final stage is set to be as small as possible. The quiescent current IQ in the final stage is set freely by setting the current I2 of the adjustable current source, which is a fraction of the quiescent current IQ.

I claim:

1. An amplifier output stage, comprising:
   a final stage;
   a preliminary stage connected to said final stage and having a multiplicity of adjustable current sources for setting a quiescent current in said final stage; and
   a control device connected to said preliminary stage and having a control current from which control voltages are generated and regulated in accordance with said multiplicity of adjustable current sources of said preliminary stage, and each of the control voltages controlling precisely one of said multiplicity of adjustable current sources in said preliminary stage, the control current in said control device is proportional to the quiescent current in said final stage, said preliminary stage having two circuits selected from the group consisting of emitter follower circuits and source follower circuits, and each of said two circuits containing precisely one of said multiplicity of adjustable current sources.

2. The amplifier output stage according to claim 1, wherein said the control device has two circuits selected from the group consisting of emitter follower circuits and source follower circuits, said two circuits simulating said two circuits of said preliminary stage in a non-driven state.

3. The amplifier output stage according to claim 1, wherein said final stage has a first transistor and a second transistor in push-pull class AB operation.

4. The amplifier output stage according to claim 3, wherein said control device has a first transistor, a second transistor, and an adjustable current source, said first transistor of said control device simulating said first transistor of said final stage, said second transistor of said control device simulating said second transistor of said final stage, and said adjustable current source feeding a control current into said first transistor and said second transistor of said control device.

5. The amplifier output stage according to claim 4, wherein said control device has a first mirror transistor and a second mirror transistor, said first mirror transistor mirroring a current through said first transistor of said control device and said second mirror transistor mirroring a current through said second transistor of said control device.

6. The amplifier output stage according to claim 5, wherein said control device has a first control transistor and a second control transistor, said first control transistor setting the current flowing into said first mirror transistor, and said second control transistor setting the current flowing into said second mirror transistor.

7. The amplifier output stage according to claim 2, wherein:
   each of said two circuits of said control device have an adjustable current source; and
   said control device has a first regulating operational amplifier and a second regulating operational amplifier, said first regulating operational amplifier regulating a first control voltage received by said adjustable current source of a first of said two circuits of said control device and said second regulating operational amplifier regulating a second control voltage received by said adjustable current source of a second of said two circuits of said control device.

8. The amplifier output stage according to claim 1, wherein said final stage, said preliminary stage and said control device are formed of transistors selected from the group consisting of p-channel MOSFET transistors using CMOS technology and n-channel MOSFET transistors using CMOS technology.

9. The amplifier output stage according to claim 4, wherein the control current in said control device is a fraction of the quiescent current flowing through said first transistor and said second transistor of said final stage, the fraction being determined by a channel width/length ratio of said second transistor of said control device, by a channel width/length ratio of said second transistor of said final stage, by a channel width/length ratio of said first transistor of said control device, and by a channel width/length ratio of said first transistor of said final stage.

10. The amplifier output stage according to claim 2, wherein said final stage, said preliminary stage and said control device form an integrated circuit.

11. The amplifier output stage according to claim 10, wherein a first of said two circuits of said preliminary stage and a first of said two circuits of said control device and a second of said two circuits of said preliminary stage and a second of said two circuits of said control device lie directly next to one another on said integrated circuit.

\* \* \* \* \*